(12) United States Patent
Park et al.

(10) Patent No.: US 8,008,647 B2
(45) Date of Patent: Aug. 30, 2011

(54) NITRIDE SEMICONDUCTOR DEVICE WITH SUPERLATTICE ACTIVE LAYER INCLUDING BARRIER LAYERS WITH DIFFERENT ENERGY BAND GAPS

(75) Inventors: Seong Eun Park, Gyunggi-do (KR); Min Ho Kim, Gyunggi-do (KR); Jae Woong Han, Gyunggi-do (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 41 days.

(21) Appl. No.: 11/907,169

(22) Filed: Oct. 10, 2007

(65) Prior Publication Data

US 2009/0045392 A1 Feb. 19, 2009

(30) Foreign Application Priority Data

Dec. 26, 2006 (KR) ................ 10-2006-0134120

(51) Int. Cl.
 *H01L 33/06* (2010.01)
 *H01L 33/32* (2010.01)
 *H01L 31/00* (2006.01)
 *H01L 31/0248* (2006.01)

(52) U.S. Cl. ........... 257/13; 257/14; 257/15; 257/17; 257/22; 257/79; 257/103; 257/E33.008; 438/22; 438/34; 438/35

(58) Field of Classification Search .......... 257/13, 257/14, E33.008
See application file for complete search history.

(56) References Cited

U.S. PATENT DOCUMENTS

| | | | | |
|---|---|---|---|---|
| 5,920,766 A * | 7/1999 | Floyd | ............... | 438/35 |
| 7,084,421 B2 * | 8/2006 | Koike et al. | ............... | 257/14 |
| 2004/0125839 A1 * | 7/2004 | Lee et al. | ............... | 372/45 |
| 2006/0131604 A1 * | 6/2006 | Kozaki | ............... | 257/103 |

FOREIGN PATENT DOCUMENTS

| | | |
|---|---|---|
| EP | 1 729 385 A1 | 12/2006 |
| JP | 05-102604 | 4/1993 |
| JP | 05-190902 | 7/1993 |
| JP | 07-170022 | 7/1995 |

(Continued)

OTHER PUBLICATIONS

Japanese Office Action, with English translation thereof, issued in Japanese Patent Application No. 2007-271364, dated Aug. 17, 2010.

*Primary Examiner* — Ha Tran T Nguyen
*Assistant Examiner* — Raj Gupta
(74) *Attorney, Agent, or Firm* — McDermott Will & Emery LLP

(57) ABSTRACT

There is provided a nitride semiconductor device including an active layer of a superlattice structure. The nitride semiconductor device including: a p-type nitride semiconductor layer; an n-type nitride semiconductor layer; and an active layer disposed between the p-type and n-type nitride layers, the active layer comprising a plurality of quantum barrier layers and quantum well layers deposited alternately on each other, wherein the active layer has a superlattice structure where the quantum barrier layer has a thickness for enabling a carrier injected from the p-type and n-type nitride semiconductor layers to be tunneled therethrough, and at least one of the quantum barrier layers has an energy band gap greater than another quantum barrier layer adjacent to the n-type nitride semiconductor layer.

9 Claims, 3 Drawing Sheets

FOREIGN PATENT DOCUMENTS

| | | |
|---|---|---|
| JP | 07-275732 | 10/1995 |
| JP | 10-41545 | 2/1998 |
| JP | 2002-270894 | 9/2002 |
| JP | 2002270894 A * | 9/2002 |
| JP | 2003-031902 | 1/2003 |
| JP | 2003-520453 | 7/2003 |
| JP | 2003204122 A * | 7/2003 |
| WO | WO 2006030064 A1 * | 3/2006 |

* cited by examiner

US 8,008,647 B2

NITRIDE SEMICONDUCTOR DEVICE WITH SUPERLATTICE ACTIVE LAYER INCLUDING BARRIER LAYERS WITH DIFFERENT ENERGY BAND GAPS

CROSS-REFERENCE TO RELATED APPLICATIONS

This application claims the priority of Korean Patent Application No. 2006-0134120 filed on Dec. 26, 2006, in the Korean Intellectual Property Office, the disclosure of which is incorporated herein by reference.

BACKGROUND OF THE INVENTION

1. Field of the Invention

The present invention relates to a nitride semiconductor device, and more particularly, to a nitride semiconductor device having an active layer of a superlattice structure.

2. Description of the Related Art

In general, a nitride semiconductor is widely used in a green or blue light emitting diode (LED) or a laser diode (LD) serving as a light source for full-color displays, image scanners, various signal systems and optical communication devices. This nitride semiconductor device generates and emits light in an active layer by recombination of electrons and holes.

The active layer features a single quantum well (SQW) structure having a single quantum well layer and a multi quantum well (MQW) structure having a plurality of quantum well layers each having a thickness smaller than 100□. Notably, the active layer of the MQW structure exhibits higher optical efficiency with respect to current and better light emitting output than the active layer of the SQW structure. This has brought about active utilization of the MQW structure.

Optical efficiency of this nitride semiconductor device is basically determined by internal quantum efficiency, i.e., a recombination rate of electrons and holes in the active layer. Studies for achieving higher internal quantum efficiency have been focused chiefly on improving a structure of the active layer itself or increasing effective mass of carriers.

However, the electrons and holes, if non-uniform with respect to each other in mobility, cause some carriers not to be recombined in the active layer, thereby lowering a recombination rate for desired light emission inside the active layer.

Therefore, to increase effective mass of the carriers in the active layer, a smaller number of carriers should be recombined outside the active layer. Especially, to maximize a capture rate of electrons and holes, there should be a method in place to confine the electrons which are relatively more mobile than the holes, inside the active layer.

SUMMARY OF THE INVENTION

An aspect of the present invention provides a nitride semiconductor device having an active layer of a superlattice structure, thereby enhancing recombination efficiency and increasing a capture rate of carriers in the active layer.

According to an aspect of the present invention, there is provided a nitride semiconductor device including: a p-type nitride semiconductor layer; an n-type nitride semiconductor layer; and an active layer disposed between the p-type and n-type nitride layers, the active layer including a plurality of quantum barrier layers and quantum well layers deposited alternately on each other, wherein the active layer has a superlattice structure where the quantum barrier layer has a thickness for enabling a carrier injected from the p-type and n-type nitride semiconductor layers to be tunneled therethrough, and at least one of the quantum barrier layers has an energy band gap greater than another quantum barrier layer adjacent to the n-type nitride semiconductor layer.

In the active layer of the superlattice structure for ensuring tunneling effects of carriers, the quantum barrier layers each may have a thickness of 2 to 10 nm.

The at least one quantum barrier layer may be most adjacent to the p-type nitride semiconductor layer to exert greater effects on electrons than holes injected.

The plurality of quantum barrier layers each may have a composition expressed by $Al_xGa_{1-x}N$, where $0 \leq x < 1$, and the at least one quantum barrier layer has an Al content greater than the another quantum barrier layer adjacent to the n-type nitride semiconductor layer.

The at least one quantum barrier layer may be formed of a compound semiconductor having at least one element different from the another quantum barrier layer adjacent to the n-type nitride semiconductor layer.

The at least one quantum barrier layer may have a composition expressed by $Al_xGa_{1-x}N$, where $0 \leq x < 1$, and the quantum barrier layer adjacent to the n-type nitride semiconductor layer has a composition expressed by $In_yGa_{1-y}N$, where $0 < y < 1$.

The plurality of quantum barrier layers each may have an energy band gap gradually increasing with proximity to the p-type nitride semiconductor layer.

The plurality of quantum barrier layers may include first to third quantum barrier layers sequentially disposed from the n-type nitride semiconductor layer toward the p-type nitride semiconductor layer, wherein the first quantum barrier layer has a composition expressed by $In_aGa_{1-a}N$, where $0 < a < 1$, the second quantum barrier layer is formed of GaN, and the third quantum barrier layer has a composition expressed by $Al_bGa_{1-b}N$, where $0 < b < 1$.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
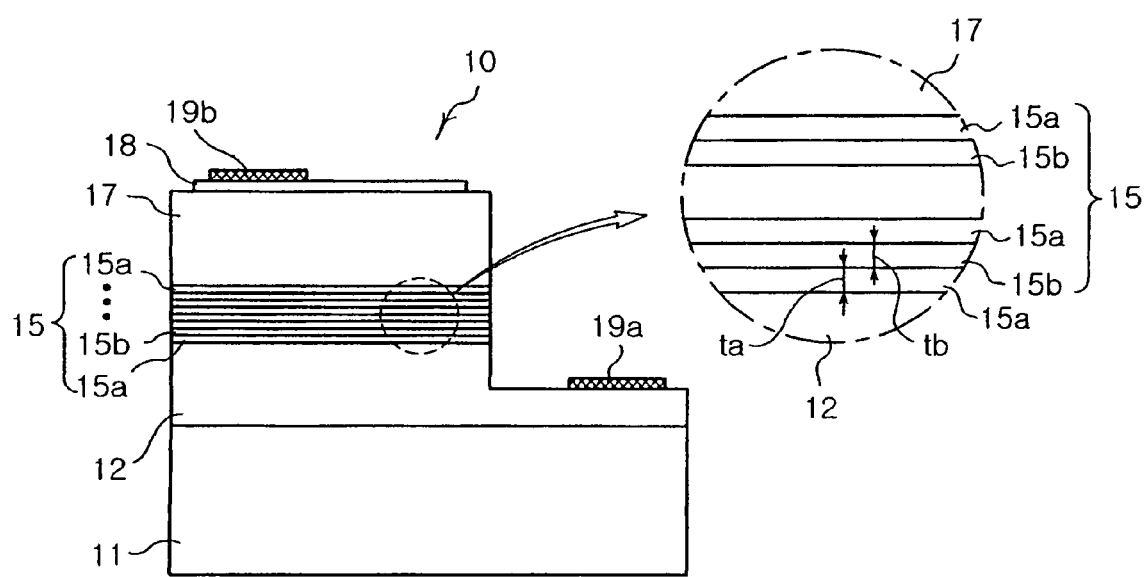
FIG. 1 is a side cross-sectional view illustrating a nitride semiconductor device according to an exemplary embodiment of the invention.

FIG. 1 is a side cross-sectional view illustrating a nitride semiconductor device according to an exemplary embodiment of the invention.

As shown in FIG. 1, the nitride semiconductor device includes a substrate 11, an n-type nitride semiconductor layer 12, an active layer 15, and a p-type nitride semiconductor layer 17. The n-type nitride semiconductor layer 12 is mesa-etched to expose a top surface thereof, and an n-electrode 19a is formed on the exposed top surface of the n-type nitride semiconductor layer 12. A transparent electrode layer 18 is formed on the p-type nitride semiconductor layer 17 and a p-electrode 19b is formed on the transparent electrode layer 18.

The present embodiment illustrates the semiconductor light emitting device of a planar structure where the electrodes 19a and 19b are disposed to face the same direction. However, the present invention is not limited thereto and it is known to a person skilled in the art that the present invention is applicable to the nitride semiconductor light emitting device of a vertical structure.

In the present embodiment, the active layer 15 is formed of a multi quantum well structure having quantum well layers 15a and quantum barrier layers 15b deposited alternately on each other. Also, the active layer is features a superlattice structure where the quantum barrier layers 15b each have a thickness tb for enabling electrons e1 and holes h injected from the n-type and p-type nitride semiconductor layers 17 and 12, respectively, to be tunneled therethrough.

In the active layer 15 of this superlattice structure, the quantum barrier layers 15b are formed to a small thickness and thus the electrons and holes can be provided to the quantum well layers 15a more effectively through tunneling, thereby increasing recombination efficiency. As described above, in the active layer 15 of the superlattice structure for achieving tunneling effects of the electrons and holes e1 and h, the quantum barrier layers 15b each may have a thickness tb of 2 to 10 nm and the quantum well layers 15a each may have a typical thickness ta of 2 to 4 nm.

Figure 2:
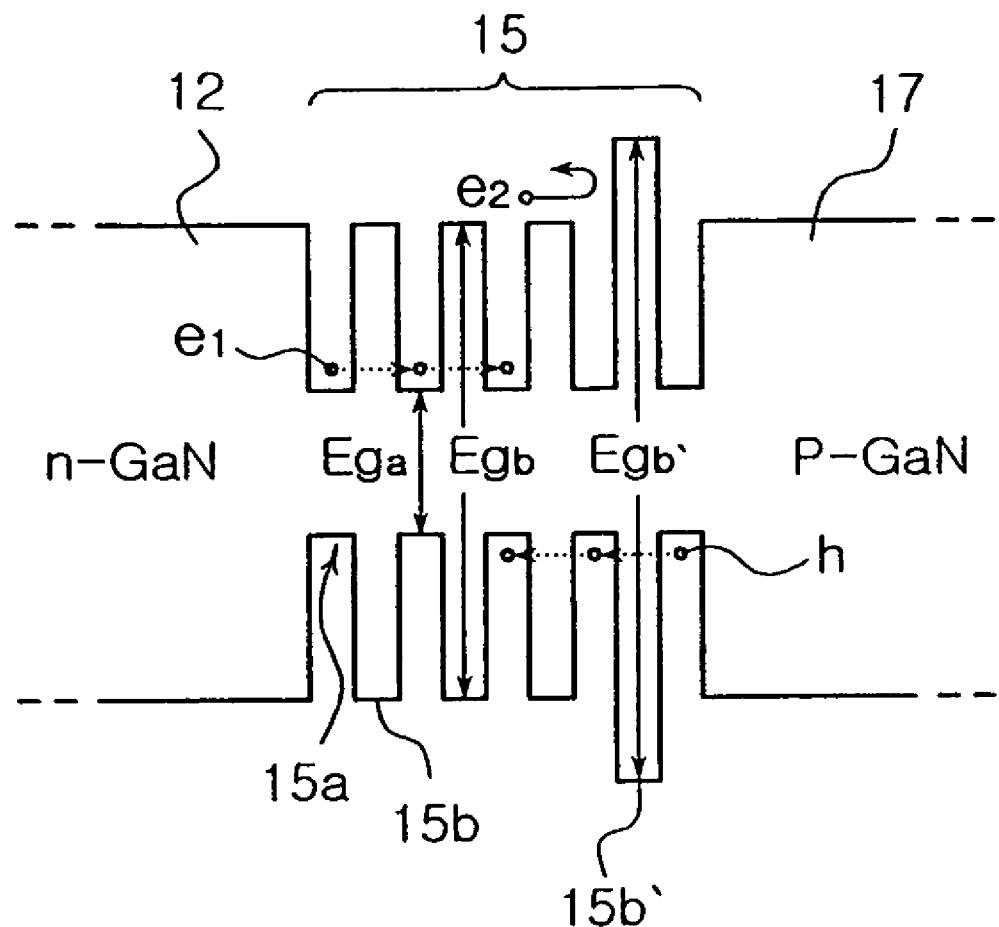
FIG. 2 is an energy band diagram illustrating an active layer of the nitride semiconductor device shown in FIG. 1.

FIG. 2 is an energy band diagram illustrating the active layer 15 of the nitride semiconductor device shown in FIG. 1.

Referring to FIG. 2, a quantum barrier layer 15b' adjacent to the p-type nitride semiconductor layer 17 has a band gap Egb' greater than an energy band gap Egb of a quantum barrier layer 15b adjacent to the n-type nitride semiconductor layer 12. To obtain the energy band gap as described above, in a case where the quantum barrier layers 15b' and 15b each have a composition expressed by $Al_xGa_{1-x}N$ ($0 \leq x < 1$), the quantum barrier layer 15b' adjacent to the p-type nitride semiconductor layer 17 may have an Al content greater than an Al content of the quantum barrier layer 15b adjacent to the n-type nitride semiconductor layer 12.

Alternatively, the quantum barrier layers 15b and 15b' may be adjusted in a band gap thereof by partial compositional change. For example, only the quantum barrier layer 15b' having a large band gap may have a composition expressed by $Al_xGa_{1-x}N$ ($0 \leq x < 1$) and the quantum barrier layer 15b more adjacent to the n-type nitride semiconductor layer 12 than the quantum barrier layer 15b may have a composition expressed by $In_yGa_{1-y}N$ ($0 < y < 1$).

The quantum barrier layer 15b' having a relatively larger band gap Egb' serves to block the electrons e2 injected from the n-type nitride semiconductor layer 12 from migrating to the p-type nitride semiconductor layer 17 without being recombined. This accordingly enhances a recombination rate in the quantum well layer 15a.

Of course, the quantum barrier layer 15b' serving as an electron confinement layer may be located differently. But in a case where the quantum barrier layer 15b' is adjacent to the p-type nitride semiconductor layer 17 as in the present embodiment, the quantum barrier layer 15b' with a high band gap exerts greater effects on the electrons e2 injected farther than the holes injected from the p-type nitride semiconductor layer 17. That is, the quantum barrier layer 15b, exerts less effects on the holes h having relatively lower mobility, while effectively blocking the electrons e2 from migrating to the p-type nitride semiconductor layer 17.

According to the present embodiment, a specific one of the quantum barriers layer is configured to have an energy band gap higher than an energy band gap of the other quantum barrier layers. A method for increasing a capture rate of the electrons is not limited to the embodiments described above, but may be realized by variously designing the energy band gap of the quantum barrier layers.

Particularly, the quantum barrier layers designed according to the present embodiment may be applied to all the quantum barrier layers. That is, the quantum barrier layers may be formed to have an energy band gap gradually increasing with proximity to the p-type nitride semiconductor layer. The present embodiment can be explained with reference to an energy band diagram of the active layer 35 shown in FIG. 3.

Figure 3:
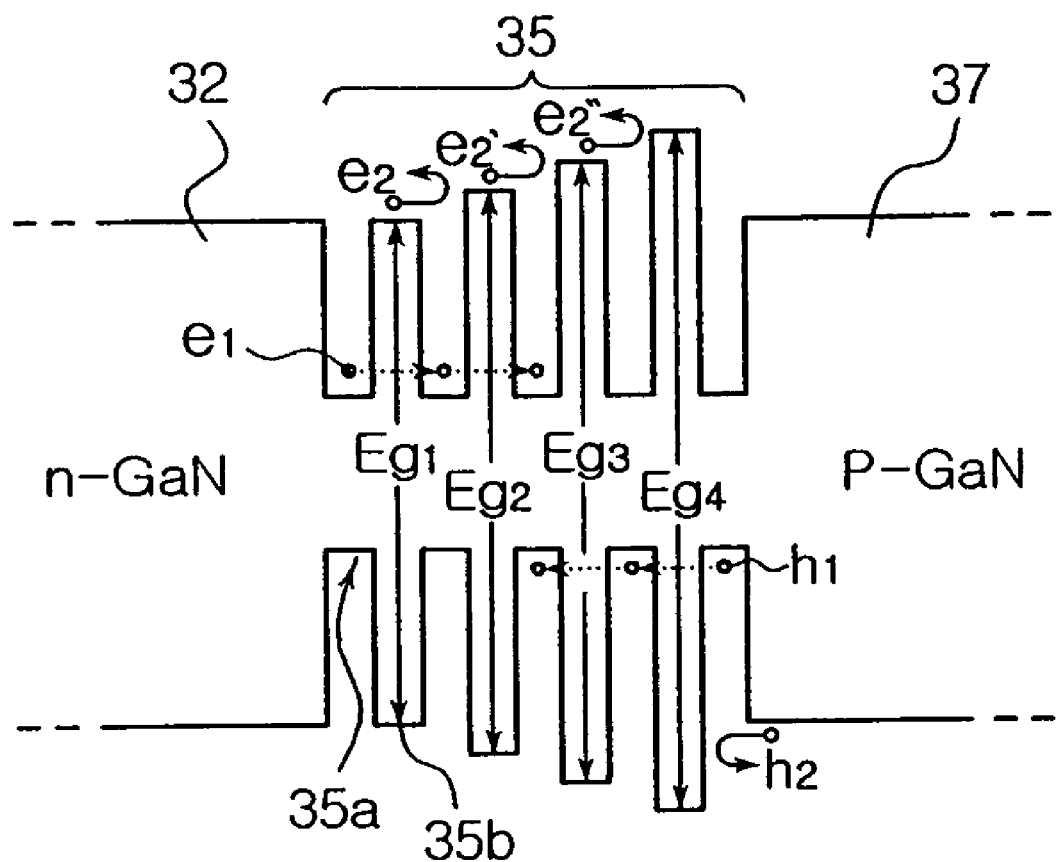
FIG. 3 is an energy band diagram illustrating an active layer applicable to a nitride semiconductor device according to an exemplary embodiment of the invention.

The active layer 35 whose band gap diagram is illustrated in FIG. 3 is understood to be interposed between the p-type nitride semiconductor layer 37 and the n-type nitride semiconductor layer 32, in a similar manner to the embodiment of FIG. 3.

The active layer 35 is formed of a multi quantum well structure including quantum well layers 35a and quantum barrier layers 35b deposited alternately on each other. Also, the active layer 35 features a superlattice structure where the quantum barrier layers 35b each have a thickness for enabling the electrons e1 and holes h1 injected from the n-type and p-type nitride semiconductor layers 37 and 32, respectively, to be tunneled therethrough.

In the present embodiment, the quantum barrier layers 35b are designed to have energy band gaps different form one another. That is, the first to fourth quantum barrier layers 35b disposed from the n-type nitride semiconductor layer 32 toward the p-type nitride semiconductor layer 37 are composed of a compound semiconductor having an energy band gap gradually increasing. More specifically, in a direction from the n-type nitride semiconductor layer 32 toward the p-type nitride semiconductor layer 37, the quantum barrier layers 35b have energy band gaps satisfying $Eg1 < Eg2 < Eg3 < Eg4$.

As described above, the quantum barrier layers 35b have an energy band gap increasing with proximity to the p-type nitride semiconductor layer 37. This allows the quantum barrier layers 35b to effectively block the electrons e2 from migrating to the p-type nitride semiconductor layer and to exert less effects on the holes h1 and h2 entering the active layer 35. This consequently enhances a capture rate of highly mobile electrons in the active layer 35, thereby significantly boosting recombination efficiency contributing to light emission.

As in the present embodiment, the quantum barrier layers 35b, when configured to have different band gaps from one another, should exhibit appropriate differences in band gaps thereof. Accordingly the band gap differences of the quantum barrier layers 35b can be hardly adjusted by altering contents of some elements in the composition thereof. Therefore, the quantum barrier layers 35b may be formed of a compound semiconductor having compositional changes. For example, a group of the quantum barrier layers adjacent to the n-type nitride semiconductor layer 32 may have a composition expressed by $In_aGa_{1-a}N$ ($0 < a < 1$) and a group of the quantum barrier layers adjacent to the p-type nitride semiconductor layer 37 may have a composition expressed by $Al_bGa_{1-b}N$ ($0 < b < 1$). Of course, the quantum barrier layer between the two groups of the quantum barrier layers may be formed of GaN, thereby ensuring a desired band gap difference adequately.

As set forth above, according to exemplary embodiments of the invention, in an active layer of a superlattice structure, one of quantum barrier layers adjacent to a p-type nitride semiconductor layer has an energy band gap greater than an energy band gap of the other quantum barrier layers, thereby effectively blocking electrons from migrating to the p-type nitride semiconductor layer. This enhances recombination efficiency of electrons and holes in the active layer, thereby producing a nitride semiconductor light emitting device high in light emitting efficiency.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor device comprising:
   a p-type nitride semiconductor layer;
   an n-type nitride semiconductor layer; and
   an active layer disposed between the p-type and n-type nitride layers and comprising a plurality of quantum barrier layers and quantum well layers deposited alternately on each other,
   wherein the active layer has a superlattice structure where the quantum barrier layer has a thickness for enabling a carrier injected from the p-type and n-type nitride semiconductor layers to be tunneled therethrough,
   at least one of the quantum barrier layers has an energy band gap greater than that of the p-type nitride semiconductor layer,
   the plurality of quantum barrier layers have different energy band gaps in order for the energy band gaps to increase with proximity to the p-type nitride semiconductor layer,
   each energy band gap of the quantum barrier layers is greater than respective energy band gaps of the quantum well layers, and
   the quantum barrier having an energy band gap greater than that of the p-type nitride semiconductor is disposed between two of the quantum well layers.

2. The nitride semiconductor device of claim 1, wherein the plurality of quantum barrier layers each have a composition expressed by $Al_xGa_{1-x}N$, where $0 \leq x < 1$, and the at least one quantum barrier layer has an Al content greater than the another quantum barrier layer adjacent to the n-type nitride semiconductor layer.

3. The nitride semiconductor device of claim 1, wherein the plurality of quantum barrier layers comprise first to third quantum barrier layers sequentially disposed from the n-type nitride semiconductor layer toward the p-type nitride semiconductor layer, wherein the first quantum barrier layer has a composition expressed by $In_aGa_{1-a}N$, where $0<a<1$, the second quantum barrier layer is formed of GaN, and the third quantum barrier layer has a composition expressed by $Al_bGa_{1-b}N$, where $0<b<1$.

4. A nitride semiconductor device comprising:
   a p-type nitride semiconductor layer;
   an n-type nitride semiconductor layer; and
   an active layer disposed between the p-type and n-type nitride layers, comprising a plurality of quantum barrier layers and quantum ell layers deposited alternately on each other,
   wherein the active layer has a superlattice structure where the quantum barrier layer has a thickness for enabling a carrier injected from the p-type and n-type nitride semiconductor layers to be tunneled therethrough,
   at least one of the quantum barrier layers has an energy band gap greater than that of another quantum barrier layer adjacent to the n-type nitride semiconductor layer and the p-type nitride semiconductor layer,
   each energy band gap of the quantum barrier layers is greater than respective energy band gaps of the quantum well layers, and
   the quantum barrier having an energy band gap greater than that of the p-type nitride semiconductor is disposed between two of the quantum well layers.

5. The nitride semiconductor device of claim 4, wherein the quantum barrier layers each have a thickness of 2 to 10 nm.

6. The nitride semiconductor device of claim 4, wherein the plurality of quantum barrier layers each have a composition expressed by $Al_xGa_{1-x}N$, where $0 \leq x < 1$, and the at least one quantum barrier layer has an Al content greater than the another quantum barrier layer adjacent to the n-type nitride semiconductor layer.

7. The nitride semiconductor device of claim 4, wherein the plurality of quantum barrier layers comprise first to third quantum barrier layers sequentially disposed from the n-type nitride semiconductor layer toward the p-type nitride semiconductor layer,
   wherein the first quantum barrier layer has a composition expressed by $In_aGa_{1-a}N$, where $0<a<1$, the second quantum barrier layer is formed of GaN, and the third quantum barrier layer has a composition expressed by $Al_bGa_{1-b}N$, where $0<b<1$.

8. The nitride semiconductor device of claim 4, wherein the at least one quantum barrier layer is formed of a compound semiconductor having at least one element different from the another quantum barrier layer adjacent to the n-type nitride semiconductor layer.

9. The nitride semiconductor device of claim 8, wherein the at least one quantum barrier layer has a composition expressed by $Al_xGa_{1-x}N$, where $0 \leq x < 1$, and the another quantum barrier layer adjacent to the n-type nitride semiconductor layer has a composition expressed by $In_yGa_{1-y}N$, where $0<y<1$.

* * * * *